United States Patent

Bechman

[11] Patent Number: 6,031,417
[45] Date of Patent: Feb. 29, 2000

[54] DIFFERENTIAL AMPLIFIER FOR MULTIPLE SUPPLY VOLTAGES AND BIASING DEVICE THEREFORE

[75] Inventor: Gary S. Bechman, Robins, Iowa

[73] Assignee: Rockwell International, Milwaukee, Wis.

[21] Appl. No.: 09/053,580

[22] Filed: Apr. 1, 1998

[51] Int. Cl.[7] ................................... G06G 7/12
[52] U.S. Cl. ................ 327/563; 327/562; 330/261
[58] Field of Search ................... 327/53, 63, 66, 327/562, 563, 307; 330/261, 253

[56] References Cited

U.S. PATENT DOCUMENTS

| 5,512,857 | 4/1996 | Koskowich | 330/252 |
| 5,550,510 | 8/1996 | Nagaraj | 330/253 |
| 5,561,396 | 10/1996 | Hogervorst et al. | 330/253 |
| 5,602,509 | 2/1997 | Kimura | 330/253 |
| 5,610,557 | 3/1997 | Jett, Jr. | 330/261 |

*Primary Examiner*—Timothy P. Callahan
*Assistant Examiner*—An T. Luu
*Attorney, Agent, or Firm*—Kyle Eppele; James P. O'Shaughnessy

[57] ABSTRACT

A switchable biasing device for an analog CMOS differential amplifier provides a supply bias current and a corresponding input bias voltage to achieve reliable performance with various power supply voltages. The bias device may include a control element having states corresponding to power supply voltages. The control element controls a supply bias circuit for supplying bias current to a differential amplifier at a level corresponding to the power supply voltage represented by a control signal from the control element. The bias current is made lower for a low power supply voltage to ensure that current source stage elements of the differential amplifier operate within their saturation region, and higher for a high power supply voltage to ensure sufficient current to maintain slew rates. The control element further controls an input bias circuit for providing a dc bias voltage at inputs of the differential amplifier at levels corresponding to the power supply voltage represented by the control signal. The control element thereby operates to select a supply bias current and input bias voltage that are appropriate for the power supply voltage.

12 Claims, 6 Drawing Sheets

DIFFERENTIAL AMPLIFIER FOR MULTIPLE SUPPLY VOLTAGES AND BIASING DEVICE THEREFORE

FIELD OF THE INVENTION

The invention pertains to the field of analog CMOS differential amplifiers. The invention addresses the problem of providing reliable performance in a single analog CMOS differential amplifier at multiple supply voltages.

BACKGROUND OF THE INVENTION

The trend in integrated circuits toward the use of progressively lower supply voltages has produced dual standards for integrated circuits in contemporary devices. At present, integrated circuits designed for operation with a 3 volt power supply (a "low power supply voltage") are preferred for low power consumption. However, integrated circuits designed for operation with a 5 volt power supply (a "high power supply voltage") continue to be widely used. It is noted here, for purposes of understanding the invention, that a power supply of a nominal voltage, e.g. "5 volts", is understood in the field to mean a supply voltage of approximately the nominal voltage, for example within plus or minus 10% of the nominal voltage.

Devices that employ integrated circuits generally include a power supply that provides either 3 or 5 volts. Some integrated circuit devices provide acceptable performance in some applications with either a low supply or a high supply voltage. However, for other types of devices, the possibility of being used at either of a low or a high power supply voltage imposes mutually exclusive constraints that arise from the majority carrier nature inherent in CMOS processes. For example, for a CMOS comparator operating at a conventional clock frequency, e.g. 44 NHz, a relatively high bias current is required to achieve the slew rate necessary for operation at a high power supply voltage. However, at a low power supply voltage the same biasing current would be excessive and drive the comparator elements beyond the available headroom, wasting power and producing undesirable signal distortion. Therefore, in accordance with conventional practices, IC manufacturers may need to produce multiple versions of an IC that are optimized for operation at different supply voltages.

While 5 volt integrated circuits will eventually be entirely supplanted by 3 volt devices, it is expected that future generation ICs will be designed for even lower supply voltages, for example, 1.8 volts. This will produce another dual standard, requiring further costly duplication of effort to manufacture multiple versions of a single IC.

SUMMARY OF THE INVENTION

In view of the state of the art discussed above, it is an object of the invention to provide an analog CMOS differential amplifier that provides reliable performance characteristics at multiple supply voltages. In accordance with the invention, this object is accomplished, in general terms, by providing a switchable biasing device for providing a supply bias and a corresponding input bias in accordance with various power supply voltage. The biasing device may include a control element for providing a control signal having states corresponding to power supply voltages. The control element controls a supply bias circuit for supplying bias current to a differential amplifier at a level corresponding to the power supply voltage represented by the control signal. The bias current is made lower for a low power supply voltage to ensure that current source stage elements operate within their saturation region, and is made higher for a high power supply voltage to ensure that there is sufficient current to maintain slew rates. The control element further controls an input bias circuit for providing a dc bias voltage at inputs of the differential amplifier at levels corresponding to the power supply voltage represented by the states of the control signal. The control element thereby operates to select a supply bias current and a corresponding input bias voltage that ensure reliable performance for the corresponding power supply voltage.

The invention may be embodied in a device for selectively biasing an analog differential amplifier to provide reliable operation at multiple supply levels. The invention may also be embodied in a differential amplifier including a biasing device for selectively biasing the differential amplifier to provide reliable operation at multiple power supply levels.

Generic and preferred embodiments in accordance with the invention and its aforementioned objectives are described in detail below.

DESCRIPTION OF THE DRAWINGS

The invention and various embodiments thereof may be understood through reference to the following detailed description in conjunction with the accompanying Figures, in which.

DETAILED DESCRIPTION OF THE INVENTION AND PREFERRED EMBODIMENTS

Figure 1:
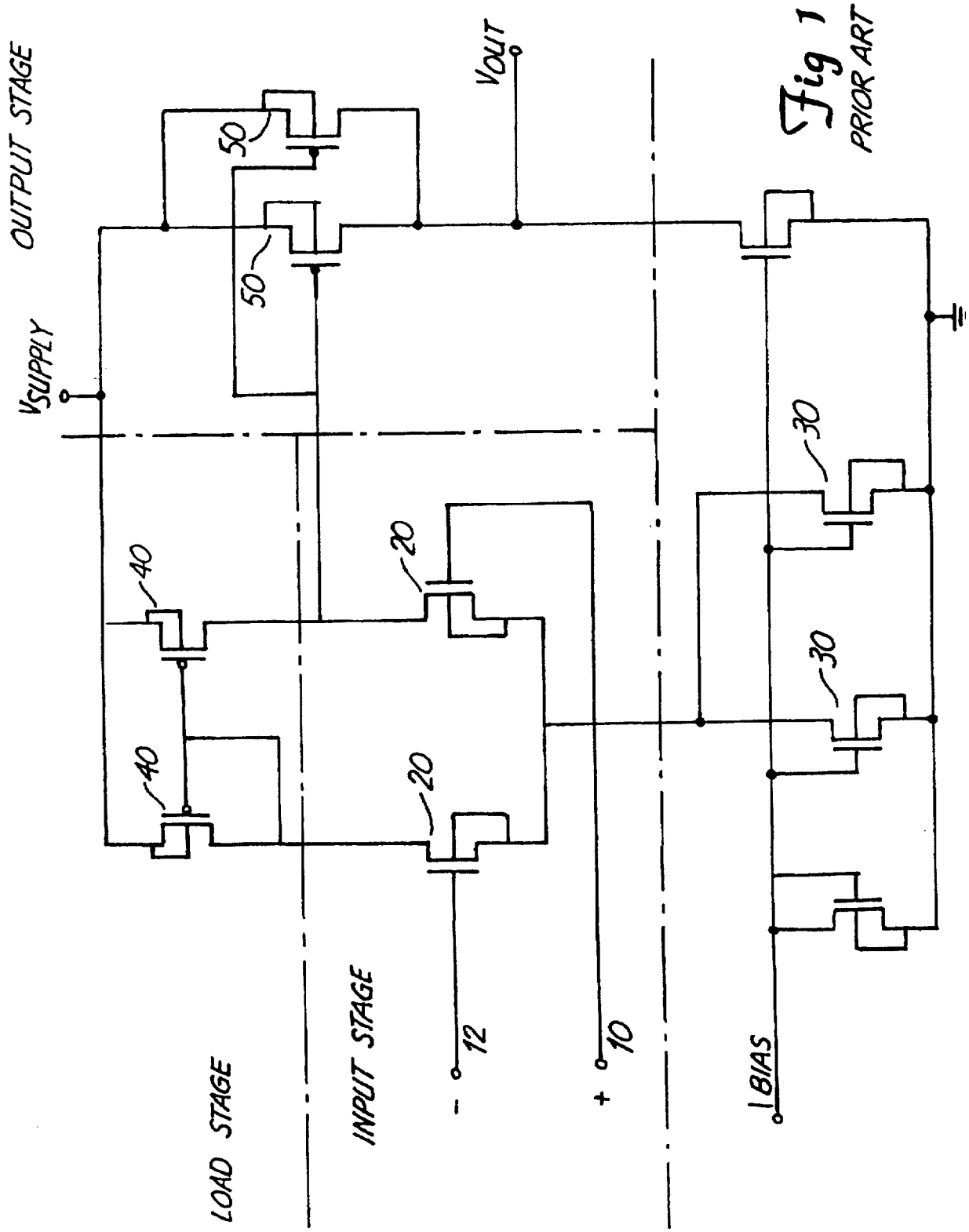

Reference is made first to FIG. 1, which shows a conventional analog CMOS differential amplifier such as may be found in a comparator or op-amp circuit. As seen in FIG. 1, the differential amplifier is comprised of four stages. Current is drawn through load stage MOSFETs 40 and input stage source coupled MOSFETs 20 by current source stage MOSFETs 30. The input stage receives input signals on respective positive and negative input lines 10, 12. Variations in the voltages on the input lines 10, 12 are determinative of the relative amounts of current flowing through the respective input stage MOSFETs 20, which in turn determine the gate voltages of output stage MOSFETs 50.

Normal performance requires the drain-source voltage $V_{DS}$ of the current source MOSFETs 30 to be sufficient to place the MOSFETs 30 in the saturation region at all times. At any instant the $V_{DS}$ of the current source MOSFETs is approximately equal to the supply voltage less the voltage drops across the load stage MOSFETs 40 and the input stage MOSFETs 20. The voltage drops across the load stage and input stage MOSFETs are approximately proportional to the sum of their respective threshold voltages $V_T$ and the square roots of their respective drain currents $I_D$.

When the device of FIG. 1 is operated at a low power supply voltage, for example, 3 volts, it is necessary to maintain the currents $I_D$ of the load stage MOSFETs 40 and input stage MOSFETs 20 at such levels that their respective voltage drops do not prevent the current source MOSFETs 30 from operation in the saturation region. Accordingly, a low bias current $I_{BIAS}$ is called for. On the other hand, when the device of FIG. 1 is operated at a high power supply voltage, a higher bias current in the current stage is required to provide sufficient current for maintaining slew rates. In conventional devices, such a current level can produce a voltage drop across the input stage MOSFETs 20 that prevents the current stage MOSFETs from operating in the saturation region, thereby degrading device performance.

In accordance with the invention, this problem is addressed by providing a dc bias voltage on the input lines 10, 12 when the device is operated at a high power supply voltage. With the high supply voltage, $I_{BIAS}$ is high, producing a relatively high voltage drop across the input stage MOSFETs 20. This effect may be offset by the effect of added dc bias at the gates of the input stage MOSFETs 20. The lowered voltage drop across the input stage MOSFETs 20 accordingly avoids pushing the current source stage MOSFETs 30 out of the saturation region.

Figure 2:
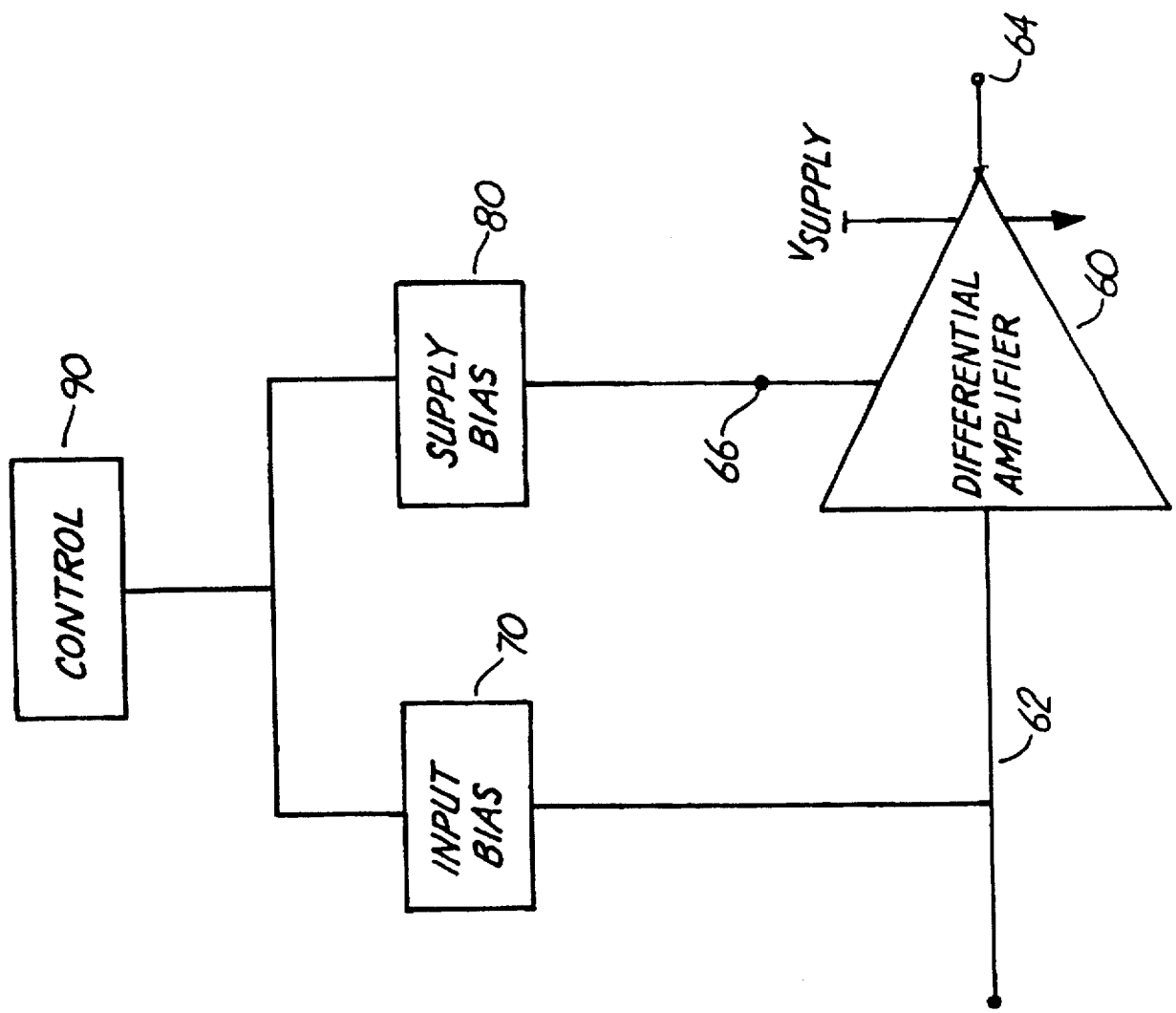
Figure 3:
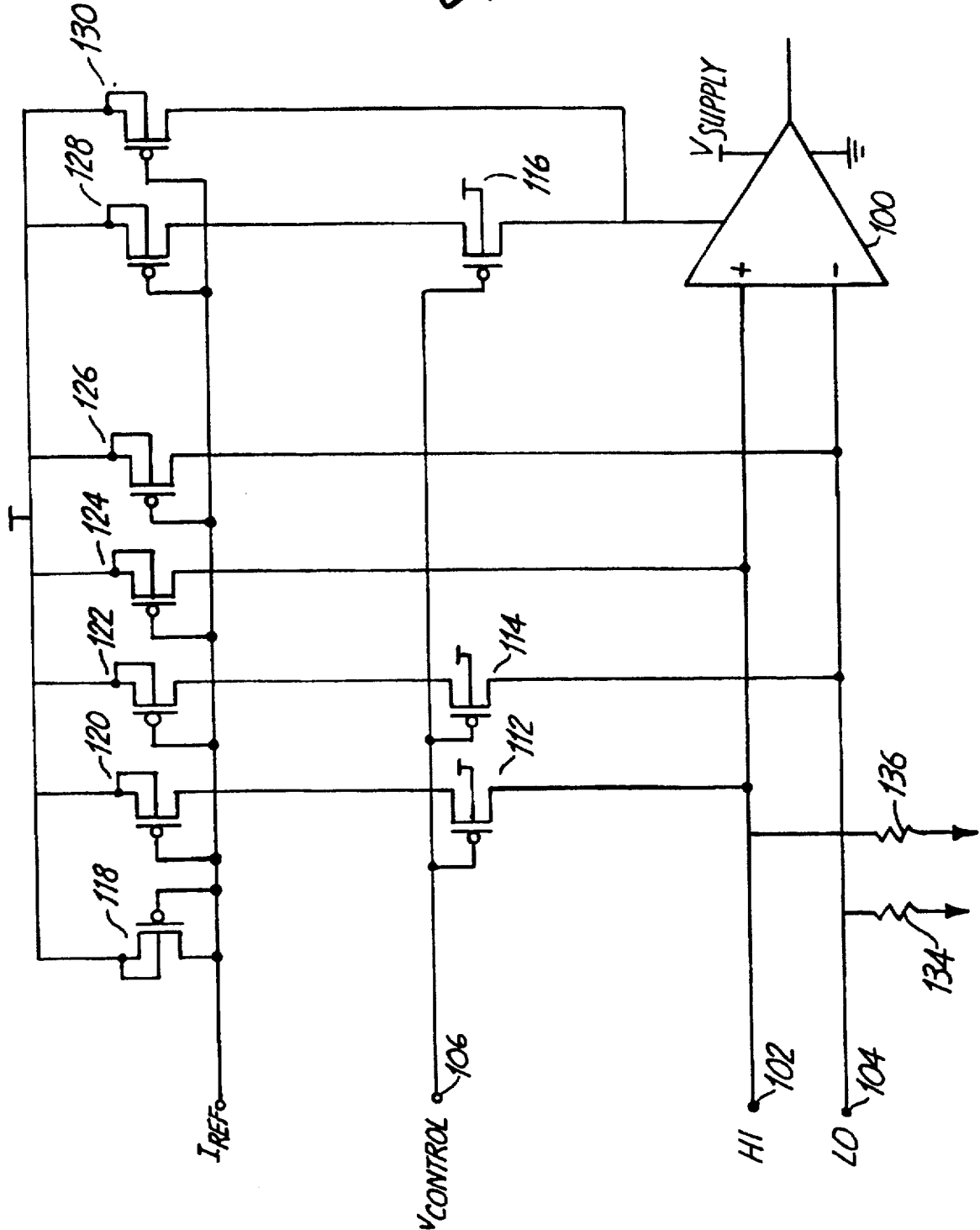
Figure 4:
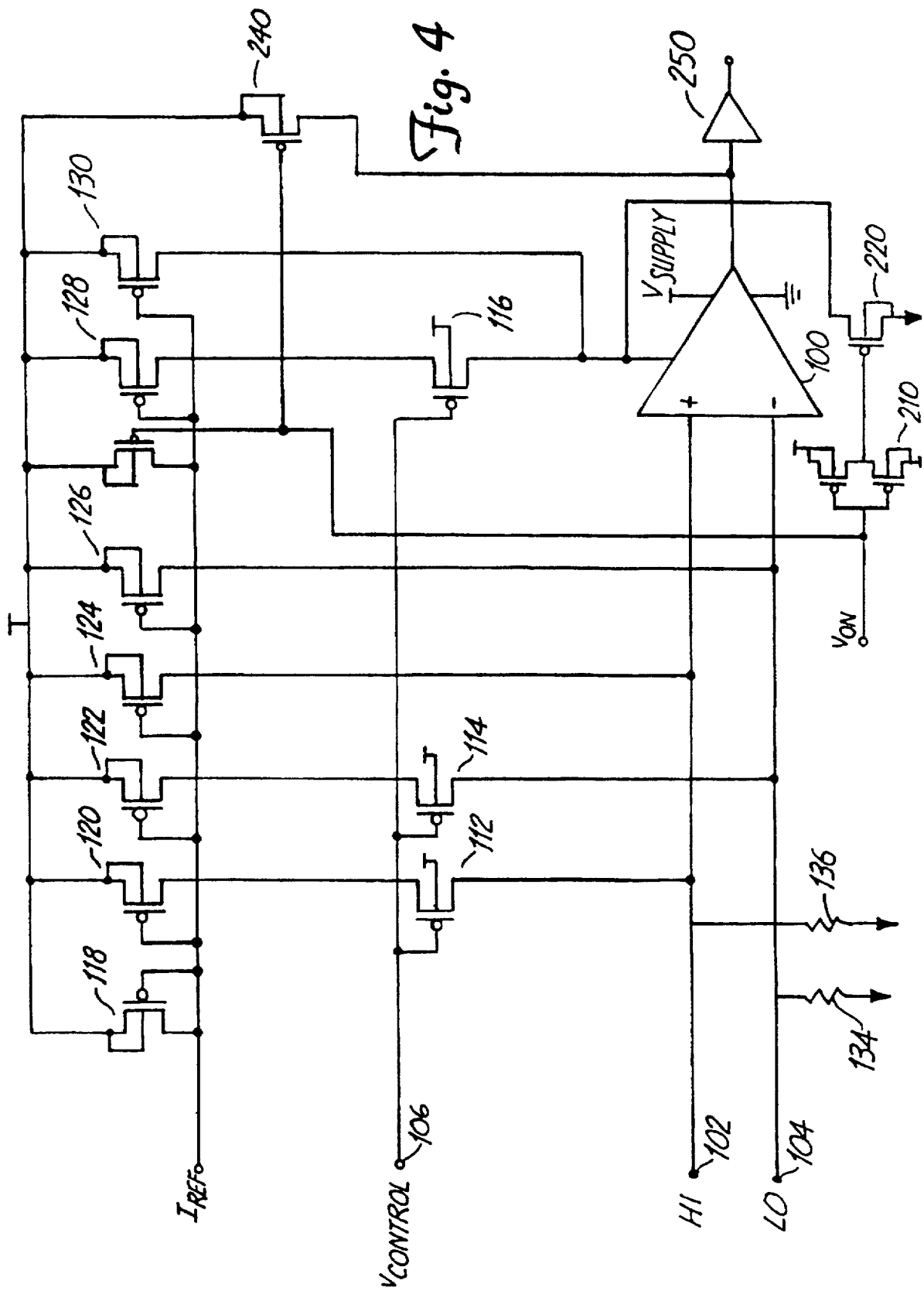

Reference is now made to FIG. 2, which shows a generic embodiment in accordance with the invention. The generic embodiment is not intended to be representative of all possible embodiments of the invention, but rather is exemplary of functions that may be performed in a device in accordance with the invention.

As seen in FIG. 2, the generic embodiment comprises a differential amplifier 60 that receives input signals on an input line group 62 and provides an output signal on an output line 64. An input bias circuit 70 provides a dc bias voltage to signals received by the differential amplifier 60 on the input line group 62. A supply bias current is provided to a supply terminal 66 of the differential amplifier 60 from a supply bias circuit 80. The outputs of the input bias circuit 70 and the supply bias circuit 80 are produced in accordance with a control signal from a control element 90. The control signal of the control element 90 corresponds to the power supply voltage at which the differential amplifier 60 is to be operated. When the control signal represents a low power supply voltage, the supply bias circuit 80 provides a relatively low supply bias current, which provides minimal power consumption while allowing for reliable current source stage performance. Concurrently, the input bias circuit 70 may provide a dc voltage bias on the input line group 62 to offset any excessive voltage drop across the input stage MOSFETs of the differential amplifier 60 to maintain reliable current source stage performance. When the control signal represents a high power supply voltage, the supply bias circuit 80 provides a relatively high bias current which provides for sufficient slew rates. Concurrently, the input bias circuit 70 provides a dc voltage bias on the input line group 62 which offsets the augmented voltage drops across the input stage MOSFETs of the differential amplifier 60 and thereby allows reliable current source stage performance.

Figure 1A:
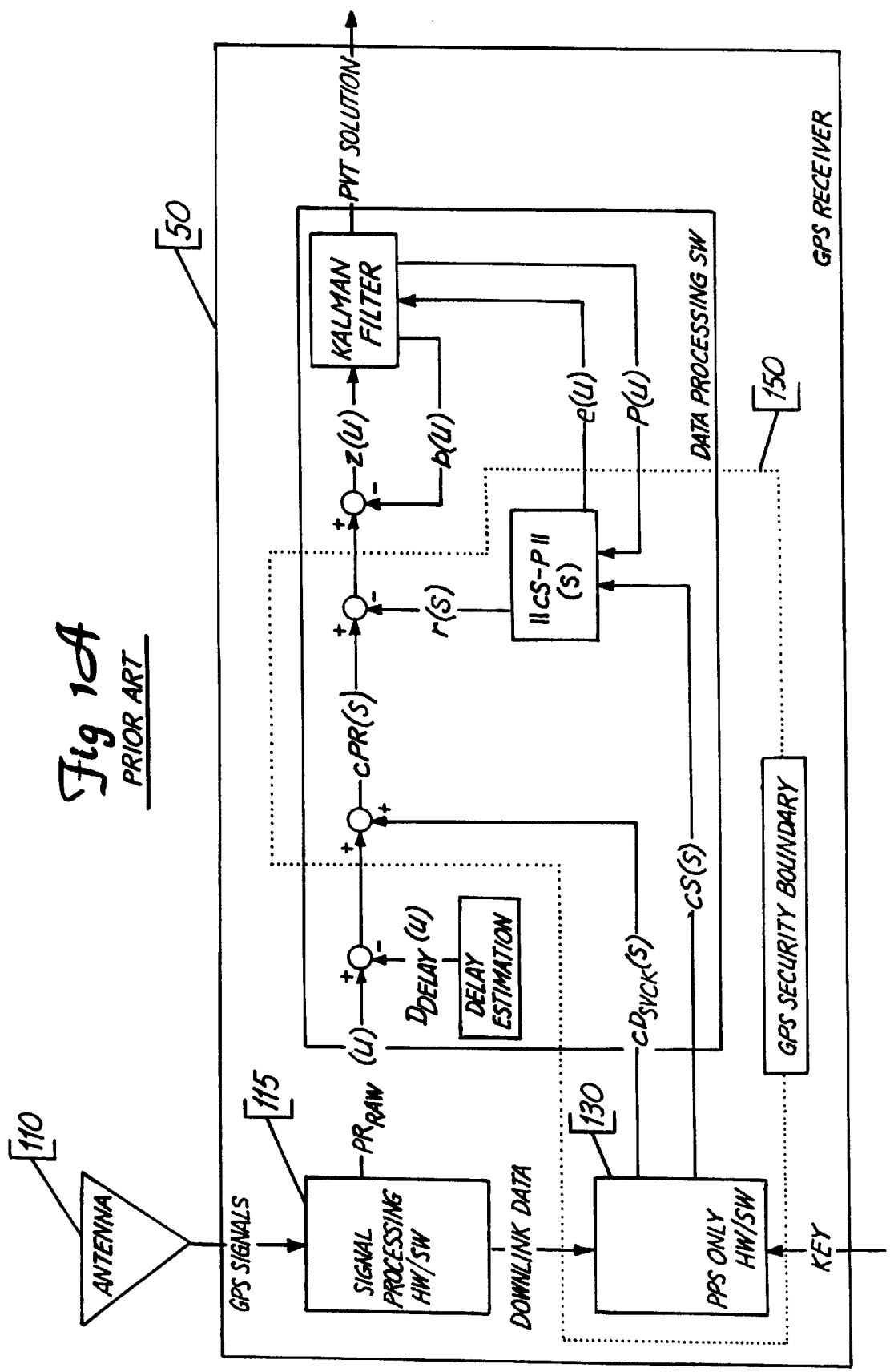
FIG. 1 shows a conventional analog CMOS differential amplifier.
Figure 1B:
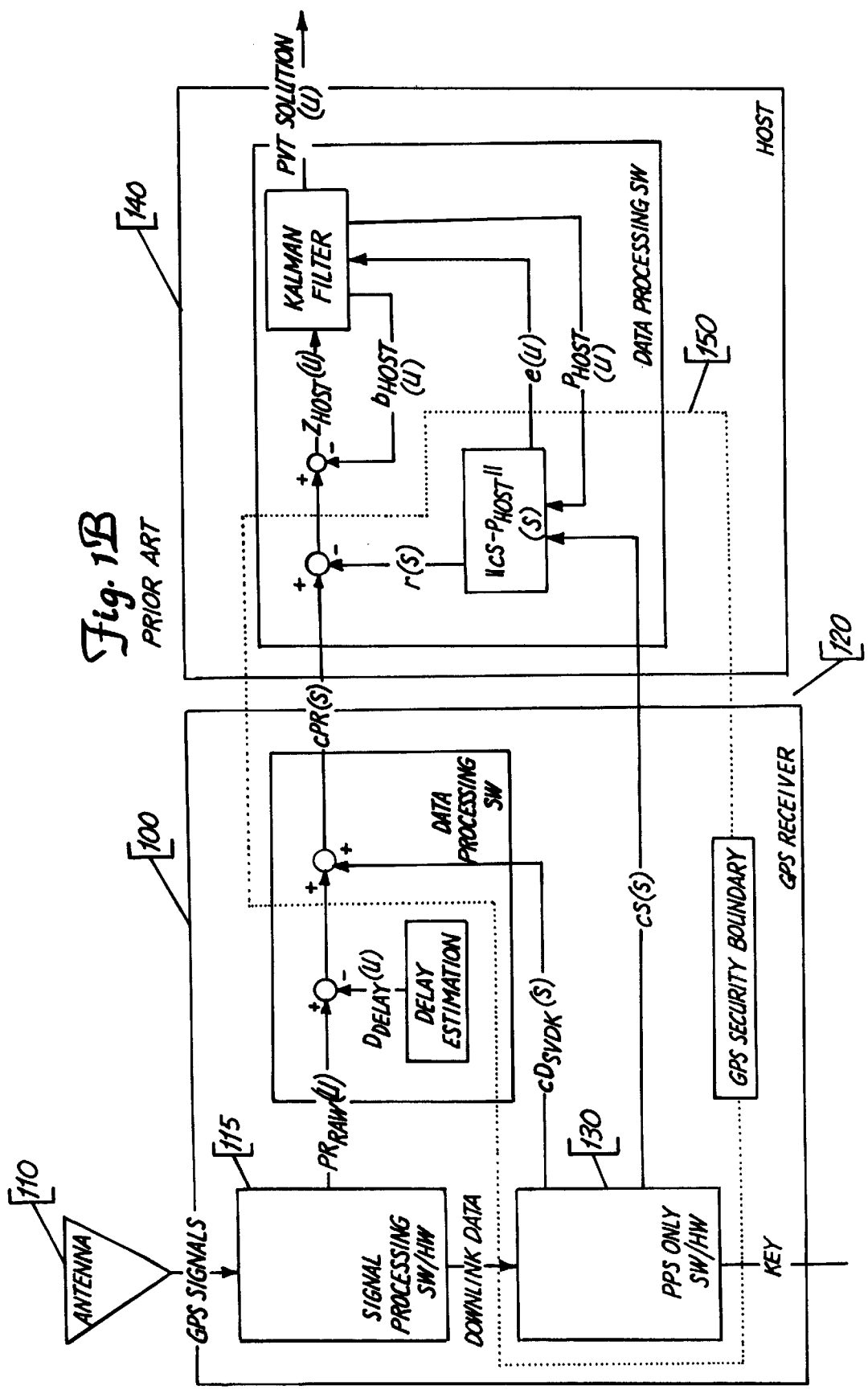
Figure 2A:
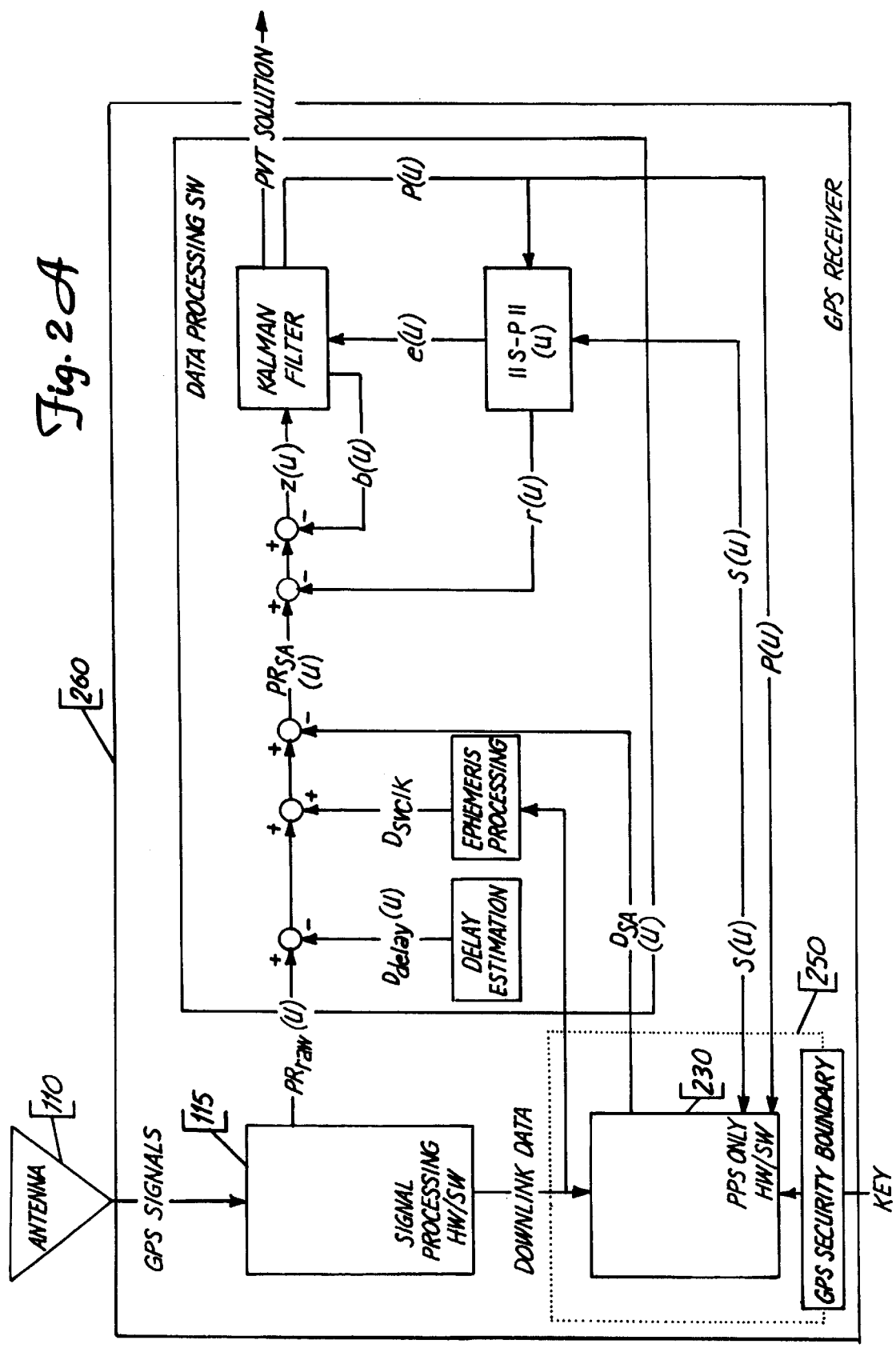
FIG. 2 shows a generic embodiment of a biasing device in accordance with the invention.
Figure 2B:
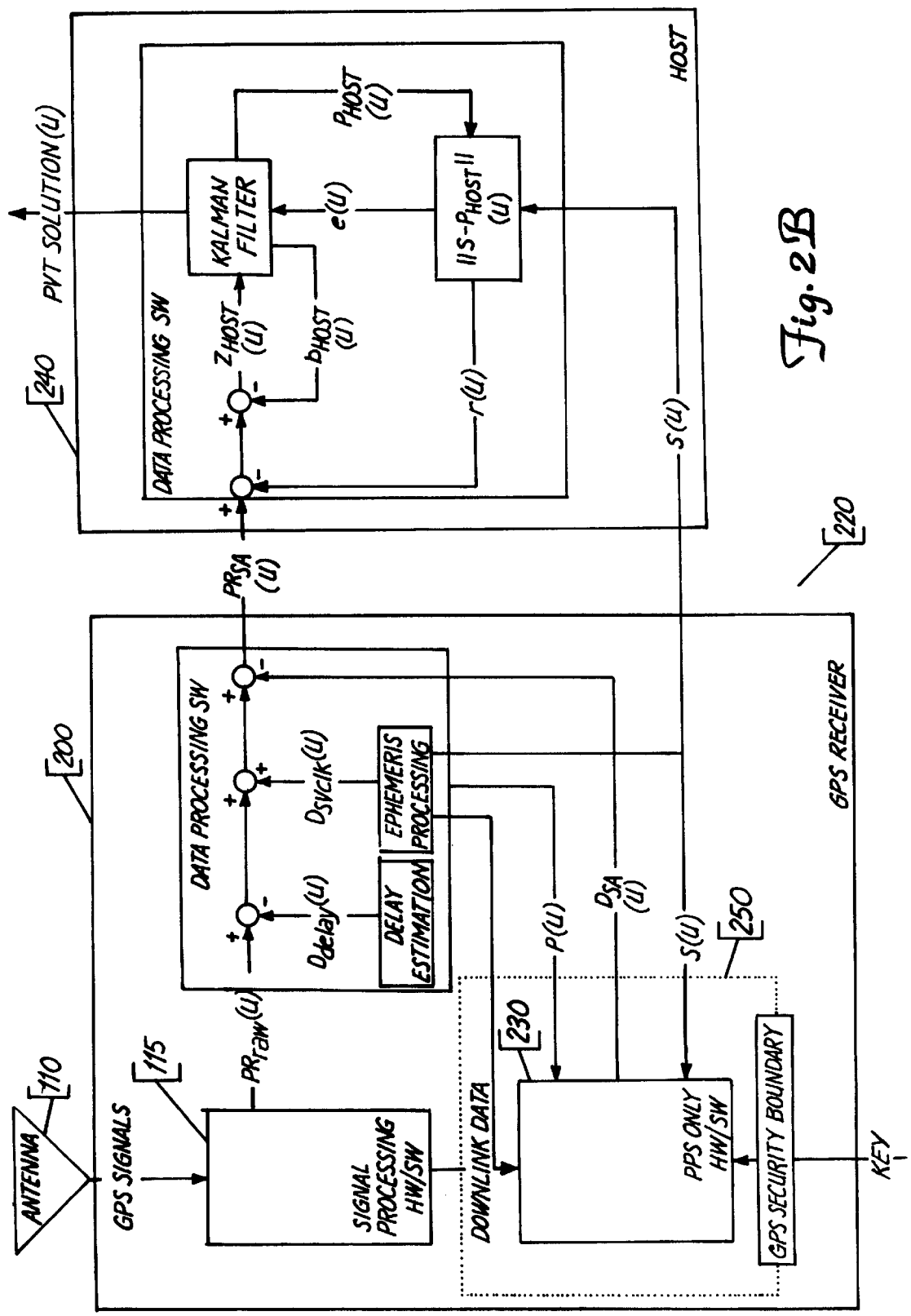
Figure 3:
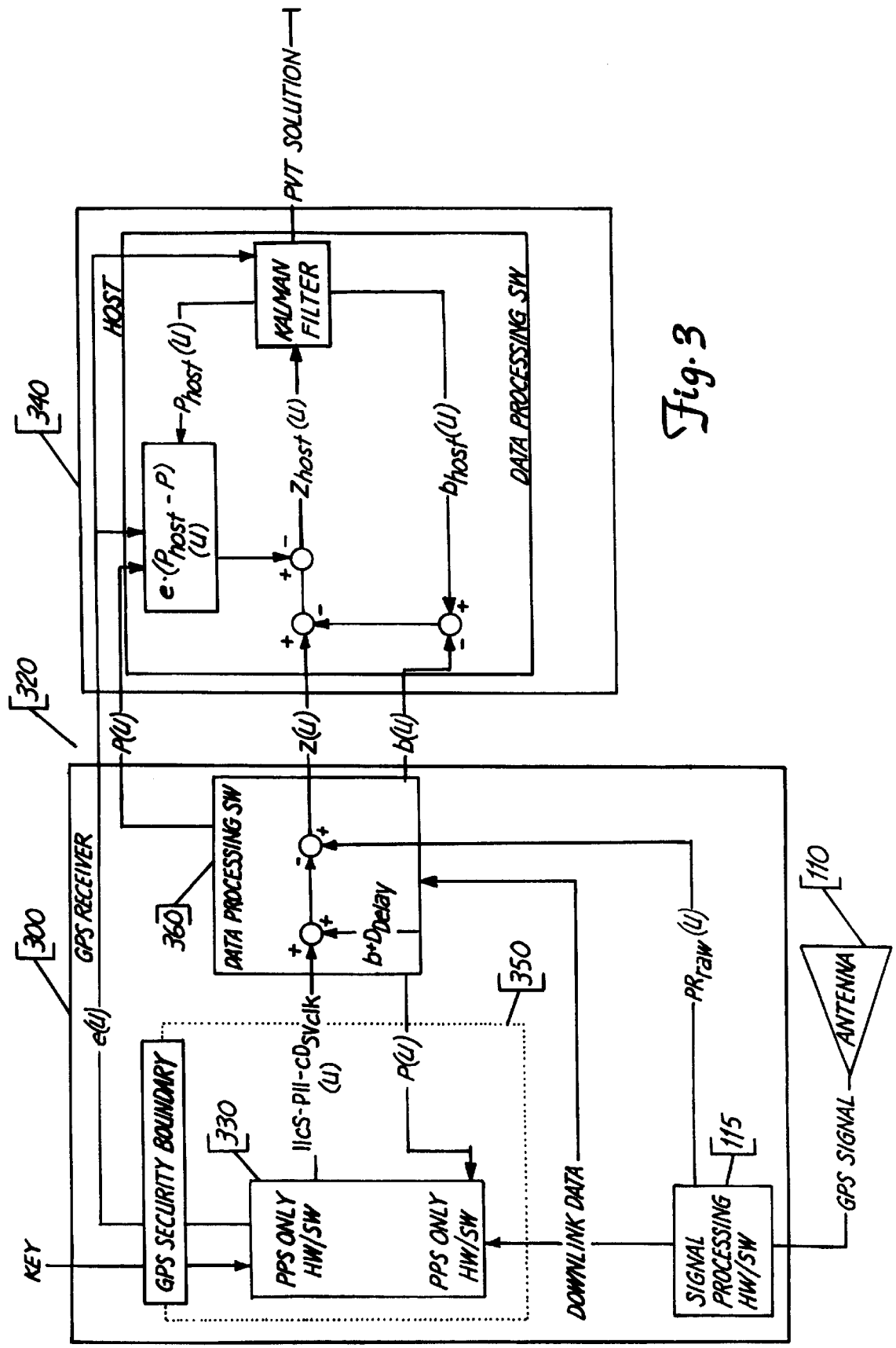
FIG. 3 shows a preferred embodiment of a biasing device in accordance with the invention.

Reference is made now to FIG. 3, which illustrates a preferred embodiment in accordance with the invention. The embodiment in FIG. 3 is preferred for operation of the conventional differential amplifier circuit of FIG. 1 at either a 3 power volt power supply voltage or a 5 volt power supply voltage.

As seen in FIG. 3, a differential amplifier (which possesses the structure illustrated in FIG. 1) receives the positive and negative components of a differential input voltage signal on respective input lines 102, 104. For purposes of the illustrated embodiment it will be assumed that the positive and negative components of the input signal have no dc component. Those having ordinary skill in the art will recognize that dc signal components may be removed from input signals through the application of appropriate filtering.

The embodiment of FIG. 3 further includes a current mirror comprised of a MOSFET 118 driven by a dc reference current $I_{REF}$. The gate voltage of the current mirror is provided to the respective gates of the current sources constituted by MOSFETs 120, 122, 124, 126, 128 and 130. It will be appreciated by those having ordinary skill in the art that the ratio of the output currents of the respective current sources to that of the current mirror is the same as the ratio of the respective current source channel dimensions to the channel dimensions of the current mirror channel. The output provided by each current source may therefore be provided accordingly.

A control signal $V_{CONTROL}$ received from a control element (not shown) on a control line 106 is representative of the supply voltage at which the differential amplifier will operate. In the illustrated embodiment, which provides operation at two power supply voltages, the signal may be a binary signal wherein a low state corresponds to operation at a low power supply voltage and a high state corresponds to operation at a high power supply voltage. Thus a control element for the illustrated embodiment may comprise a jumper or other switching mechanism for connecting the control line 106 to ground or to a supply voltage in accordance with the supply voltage to be represented. It is noted that in some applications it may be preferable for the control element to comprise another conventional switching device, or to comprise software running on a control processor.

The control signal $V_{CONTROL}$ is operative of input bias switching MOSFETs 112, 114 and a supply bias switching MOSFET 116. Specifically, $V_{CONTROL}$ is provided to the gates of the input bias switching MOSFETs 112 and 114 and to the supply bias MOSFET 116. When $V_{CONTROL}$ is high, the switching MOSFETs 112, 114 and 116 are off. Accordingly, supply bias current is provided to the differential amplifier 100 only by way of current source 130. Further, current is provided to input resistances 134, 136 only by way of current sources 124 and 126, resulting in the addition of a dc voltage component to the signals on the input lines 102, 104.

Conversely, when $V_{CONTROL}$ is low, the switching MOSFETs 112, 114 and 116 are on and allow current flow through their respective channels. Accordingly, supply bias current is provided to the differential amplifier 100 by way of current sources 128 and 130. In addition, current is provided to input resistances 134, 136, by way of current sources 120, 122, 124 and 126, resulting in the addition of a greater dc voltage component to the signals on the input lines 102, 104.

In the embodiment of the invention illustrated in FIG. 3, therefore, the switching transistors 112 and 114, the current mirror 118, the current sources 120, 122, 124 and 126, and the input resistances 134, 136 act in conjunction as an input bias circuit. The current mirror 118, the current sources 128 and 130, and the switching transistor 116 act in conjunction as a supply bias circuit.

Figure 4:
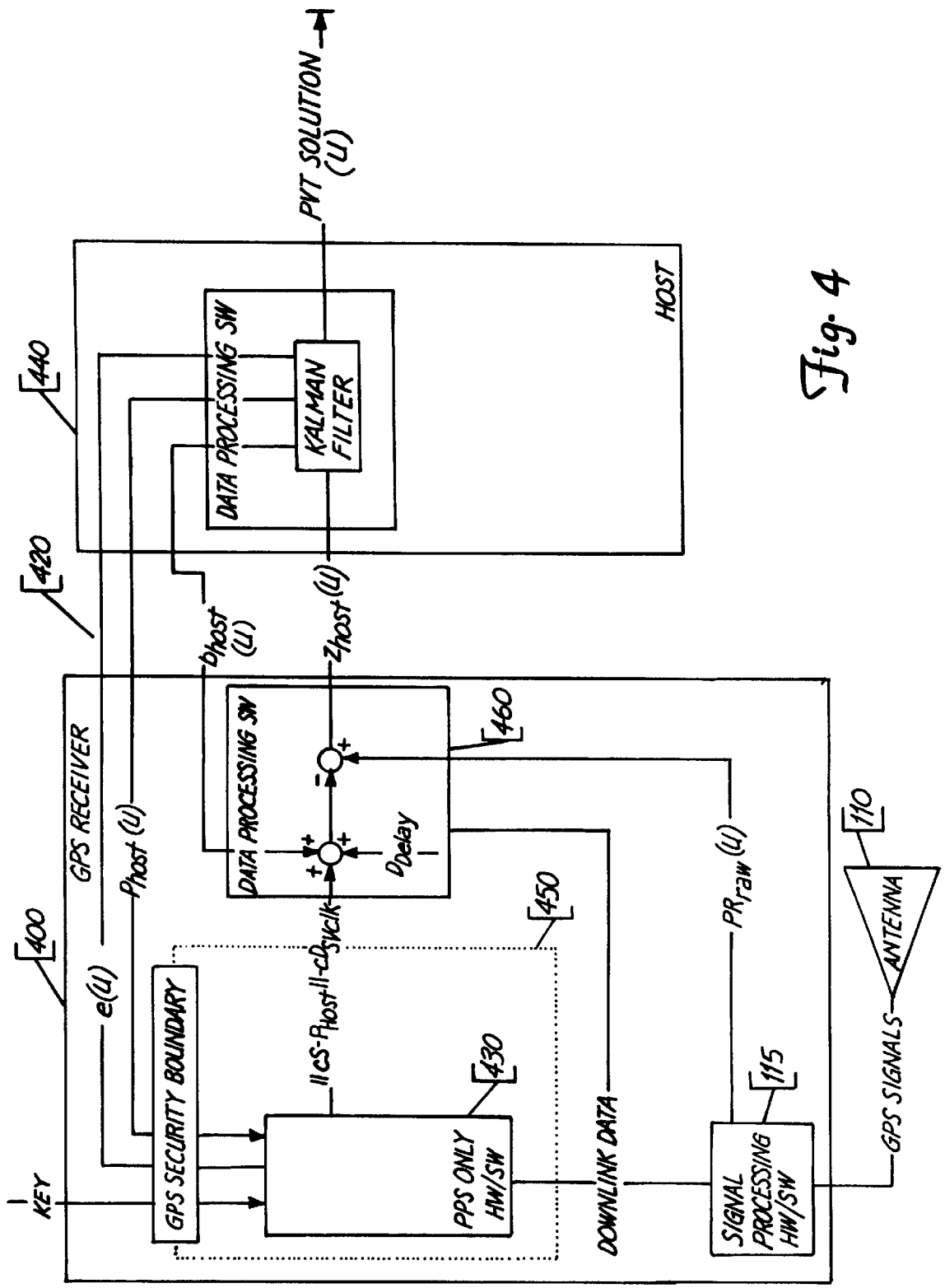
FIG. 4 shows a further preferred embodiment of a biasing device in accordance with the invention.

A preferred embodiment of the invention is illustrated in FIG. 4. It will be appreciated that the embodiment of FIG. 4 is substantially the same as that illustrated in FIG. 3. The embodiment of FIG. 4 includes the preferred features of power saving elements for powering down the bias circuits and differential amplifier in accordance with the state of a power saving mode signal $V_{ON}$. Transistor 220 receives an inverted $V_{ON}$ and ensures that current source transistors of the current source stage of the differential amplifier do not have their gates floating during operation in a power saving mode. Power saving transistors 230 and 240 are provided with $V_{ON}$ at their gates. Transistor 230 ensures that supply bias transistors 128 and 130 do not have their gates floating during operation in a power saving mode, and transistor 240 prevents input to a buffer 250 from floating.

It will be appreciated that the invention may be implemented in a wide range of embodiments apart from those illustrated in FIGS. 3 and 4. In the broadest sense, the invention may be implemented for any analog MOSFET differential amplifier for which it is desired to enable reliable operation at multiple power supply voltage, either in the form of a separate biasing device, or as an integral part of the differential amplifier design. The particular supply currents and input biases to be provided to the current source stage and input stage, respectively, may be determined through analysis of the specific differential amplifier circuit and operating parameters at issue.

Moreover, while the illustrated differential amplifier is comprised of three stages in addition to an output stage, the invention may be implemented for differential amplifiers having four or more stages in addition to an output stage. It will be appreciated from the discussion above that such embodiments will employ equivalent structures wherein the voltage drop across current source transistors is maintained within the saturation region by providing appropriate supply bias currents and corresponding input bias voltages in accordance with various power supply voltages.

It will be further appreciated that for some applications it may be preferable to provide a biasing circuit or differential amplifier in accordance with the invention that is switchable for operation in more than two power supply levels. For example, practitioners in the field will recognize that the so-called "3 volt" standard actually refers to each of two different standards, the first being a true 3 volt +/− 10% standard, and the second being a 3.3 volt +/− 10% standard. In accordance with the invention, a biasing device or differential amplifier that is switchable for reliable operation at a 3 volt, 3.3 volt or 5 volt power supply voltage may be implemented.

Accordingly, the invention should not be construed as being limited to the embodiments described specifically herein, but rather to encompass all devices possessing the features recited in any of the appended claims.

What is claimed is:

1. A biasing device for a MOSFET differential amplifier, comprising:
    a control element for providing a control signal wherein the control signal is a binary signal, wherein a first state represents a low supply voltage and a second state represents a high supply voltage;
    a supply bias circuit for providing a supply bias current to a current source stage of the differential amplifier in accordance with the control signal; and
    an input bias circuit for providing an input bias voltage to gates of input stage source coupled MOSFETs of the differential amplifier in accordance with the control signal;
    the supply bias circuit and input bias circuit providing respective biases in conjunction to maintain operation of MOSFETs of the current source stage of the differential amplifier in the saturation region.

2. The biasing device claimed in claim 1, wherein the supply bias circuit comprises:
    a first current source for providing a first current as a supply bias current corresponding to the low power supply voltage;
    a second current source for providing a second current, the sum of the first and second current corresponding to the high power supply voltage; and
    a switch operative of the second current source in accordance with the control signal.

3. The biasing device claimed in claim 2, wherein the switch comprises a MOSFET for receiving the control signal at its gate terminal.

4. The biasing device claimed in claim 1, wherein the input bias circuit comprises:
    a first current source pair for providing first respective driving currents to respective input resistances to generate first dc input potentials at respective input terminals of the differential amplifier corresponding to the low power supply voltage;
    a second current source pair for providing second respective driving currents to the respective input resistances, the respective potentials generated by the respective sums of the first and second driving currents corresponding to the high power supply voltage; and
    a switch operative of the second current source pair in accordance with the control signal.

5. The biasing device claimed in claim 4, wherein the switch comprises a MOSFET pair for receiving the control signal at its respective gate terminals.

6. The bias circuit claimed in claim 1, wherein the high power supply voltage is 5 volts and the low power supply voltage is 3 volts.

7. An analog MOSFET differential amplifier, comprising:
    an input stage for receiving positive and negative input voltages on gates of respective source coupled MOSFETS;
    a current source stage for drawing current from a supply through a load stage and the input stage to ground:
    an output stage for providing an output current in accordance with the positive and negative voltages on the gates of the respective source coupled MOSFETs;
    a control element for providing a control signal wherein the control signal is a binary signal, wherein a first state represents a low supply voltage and a second state represents a high supply voltage;
    a supply bias circuit for providing a supply bias current to the current source stage in accordance with the control signal; and
    an input bias circuit for providing an input bias voltage to gates of the input stage source coupled MOSFETs in accordance with the control signal;
    the supply bias circuit and input bias circuit providing respective biases in conjunction to maintain operation of MOSFETs of the current source stage in the saturation region.

8. The differential amplifier claimed in claim 7, wherein the supply bias circuit comprises:
    a first current source for providing a first current as a supply bias current corresponding to the low power supply voltage;
    a second current source for providing a second current, the sum of the first and second current corresponding to the high power supply voltage; and
    a switch operative of the second current source in accordance with the control signal.

9. The differential amplifier claimed in claim 8, wherein the switch comprises a MOSFET for receiving the control signal at its gate terminal.

10. The differential amplifier claimed in claim 7, wherein the input bias circuit comprises:

a first current source pair for providing first respective driving currents to respective input resistances to generate first dc input potentials at respective input terminals of the differential amplifier corresponding to the low power supply voltage;

a second current source pair for providing second respective driving currents to the respective input resistances, the respective potentials generated by the respective sums of the first and second driving currents corresponding to the high power supply voltage; and a switch operative of the second current source pair in accordance with the control signal.

11. The differential amplifier claimed in claim 10, wherein the switch comprises a MOSFET pair for receiving the control signal at its respective gate terminals.

12. The differential amplifier claimed in claim 7, wherein the high power supply voltage is 5 volts and the low power supply voltage is 3 volts.

* * * * *

UNITED STATES PATENT AND TRADEMARK OFFICE
CERTIFICATE OF CORRECTION

PATENT NO. : 6,031,417
DATED : February 29, 2000
INVENTOR(S) : Gary S. Bechman

It is certified that error appears in the above-identified patent and that said Letters Patent is hereby corrected as shown below:

Replace Figures 1A, 1B, 2A, 2B, 3 and 4 with Figures 1, 2, 3 and 4

Signed and Sealed this

Thirty first Day of July, 2001

*Attest:*

*Attesting Officer*

NICHOLAS P. GODICI
*Acting Director of the United States Patent and Trademark Office*